(12) United States Patent
Son et al.

(10) Patent No.: US 9,142,405 B2
(45) Date of Patent: Sep. 22, 2015

(54) THIN FILM TRANSISTOR, METHOD OF MANUFACTURING ACTIVE LAYERS OF THE THIN FILM TRANSISTOR, AND DISPLAY DEVICE

(75) Inventors: Yong-Duck Son, Yongin (KR); Ki-Yong Lee, Yongin (KR); Jin-Wook Seo, Yongin (KR); Min-Jae Jeong, Yongin (KR); Byung-Soo So, Yongin (KR); Seung-Kyu Park, Yongin (KR); Kil-Won Lee, Yongin (KR); Yun-Mo Chung, Yongin (KR); Byoung-Keon Park, Yongin (KR); Dong-Hyun Lee, Yongin (KR); Jong-Ryuk Park, Yongin (KR); Tak-Young Lee, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 589 days.

(21) Appl. No.: 12/964,028

(22) Filed: Dec. 9, 2010

(65) Prior Publication Data
US 2011/0248276 A1    Oct. 13, 2011

(30) Foreign Application Priority Data

Apr. 7, 2010    (KR) .......................... 10-2010-0031962

(51) Int. Cl.
*H01L 29/04*    (2006.01)
*H01L 21/02*    (2006.01)
*H01L 29/66*    (2006.01)
(Continued)

(52) U.S. Cl.
CPC ...... *H01L 21/0245* (2013.01); *H01L 21/02532* (2013.01); *H01L 21/02672* (2013.01); *H01L 27/1277* (2013.01); *H01L 27/1281* (2013.01); *H01L 29/66757* (2013.01); *H01L 29/78675* (2013.01); *H01L 29/78696* (2013.01); *H01L 27/3262* (2013.01)

(58) Field of Classification Search
CPC ......... H01L 29/04; H01L 33/00; H01L 21/20; H01L 51/50; H01L 29/786; H01L 33/62; H01L 33/16; H01L 31/113; H01L 29/94; H01L 27/14; H01L 29/76
USPC ...................... 257/65, 101, 72, 59, 66, 75, 88
See application file for complete search history.

(56) References Cited

U.S. PATENT DOCUMENTS

2002/0086468 A1*   7/2002   Kim et al. ...................... 438/156
2003/0030052 A1*   2/2003   Oka et al. ......................... 257/65
(Continued)

FOREIGN PATENT DOCUMENTS

| CN | 101211985 | 7/2008 |
|---|---|---|
| JP | 07-335899 | 12/1995 |

(Continued)

OTHER PUBLICATIONS

Korean Search Report.

*Primary Examiner* — Chuong A Luu
(74) *Attorney, Agent, or Firm* — H.C. Park & Associates, PLC

(57) ABSTRACT

A thin film transistor including a first polycrystalline semiconductor layer disposed on a substrate, a second polycrystalline semiconductor layer disposed on the first polycrystalline semiconductor layer, and metal catalysts configured to adjoin the first polycrystalline semiconductor layer and spaced apart from one another at specific intervals.

10 Claims, 18 Drawing Sheets

(51) Int. Cl.
  *H01L 29/786* (2006.01)
  *H01L 27/12* (2006.01)
  *H01L 27/32* (2006.01)

(56) References Cited

U.S. PATENT DOCUMENTS

| | | | |
|---|---|---|---|
| 2006/0033106 A1* | 2/2006 | Seo et al. | 257/66 |
| 2008/0157065 A1* | 7/2008 | Krishnamoorthy et al. | 257/40 |
| 2008/0224143 A1* | 9/2008 | Kim et al. | 257/59 |
| 2009/0066589 A1* | 3/2009 | Yamazaki et al. | 343/702 |
| 2011/0169010 A1* | 7/2011 | Park et al. | 257/72 |

FOREIGN PATENT DOCUMENTS

| | | | |
|---|---|---|---|
| JP | 11-204435 | | 7/1999 |
| JP | 2002-237453 | | 8/2002 |
| JP | 2003-115457 | | 4/2003 |
| JP | 2006-324564 | | 11/2006 |
| KR | 1997-0060392 | | 12/1997 |
| KR | 10-1999-0013835 | | 2/1999 |
| KR | 10-2006-0017410 | | 2/2006 |
| KR | 10-2006-0093030 | | 8/2006 |
| KR | 10-2008-0086114 | | 9/2008 |
| KR | 10200080086114 | * | 9/2008 |
| TW | 200901460 | | 1/2009 |

* cited by examiner

THIN FILM TRANSISTOR, METHOD OF MANUFACTURING ACTIVE LAYERS OF THE THIN FILM TRANSISTOR, AND DISPLAY DEVICE

CROSS-REFERENCE TO RELATED APPLICATIONS

This application claims priority to and the benefit of Korean Patent Application No. 10-2010-0031962 filed in the Korean Intellectual Property Office on Apr. 7, 2010, the entire contents of which are incorporated herein by reference.

BACKGROUND

1. Field

The described technology relates generally to a thin film transistor. More particularly, the described technology relates generally to a thin film transistor including polycrystalline semiconductor layers, a method of manufacturing the active layers of the thin film transistor, and a display device including the thin film transistor.

2. Description of the Related Art

A display device is used to display an image. An organic light emitting diode (OLED) display has been increasingly used as the display device. The organic light emitting diode (OLED) display is self-light emitting and can reduce a thickness and a weight of the display device because it does not require an additional light source, as is used in a liquid crystal display (LCD). Further, the organic light emitting diode (OLED) display has high quality characteristics, such as low power consumption, high luminance, and a high response speed. A conventional organic light emitting diode (OLED) display includes a thin film transistor (TFT) formed in each pixel of the OLED display and an organic light emitting element connected to the thin film transistor.

The thin film transistor includes a semiconductor layer. Recently, a technique for forming a silicon layer using a polycrystalline semiconductor layer through the diffusion of a metal catalyst has been developed. However, in a case in which the silicon layer is formed of a polycrystalline semiconductor layer through the diffusion of the metal catalyst, a concentration of the metal catalyst at a portion where the diffusion of the metal catalyst is ended is higher than a concentration at other portions. Accordingly, there is a problem in that a semiconductor characteristic of the polycrystalline semiconductor layer deteriorates.

The above information disclosed in this Background section is only for enhancement of understanding of the background of the described technology and therefore it may contain information that does not form the prior art that is already known in this country to a person of ordinary skill in the art.

SUMMARY

Aspects of the present invention provide a thin film transistor including a polycrystalline semiconductor layer, a method of manufacturing the active layers of the thin film transistor, and a display device having an advantage of minimizing a deterioration of the semiconductor characteristic of a polycrystalline semiconductor layer, resulting from a difference in the concentration of a metal catalyst, although a silicon layer is formed of the polycrystalline semiconductor layer through the diffusion of the metal catalyst.

Aspects of the present invention provide a thin film transistor, comprising a first polycrystalline semiconductor layer disposed on a substrate, a second polycrystalline semiconductor layer disposed on the first polycrystalline semiconductor layer, and metal catalysts configured to adjoin the first polycrystalline semiconductor layer and spaced apart from one another at specific intervals.

According to another aspect of the present invention, the first polycrystalline semiconductor layer and the second polycrystalline semiconductor layer can be crystallized using the metal catalysts.

According to another aspect of the present invention, the metal catalysts can include one or more of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

According to another aspect of the present invention, the second polycrystalline semiconductor layer can have a thickness which is 0.3 to 3 times a thickness of the first polycrystalline semiconductor layer.

According to another aspect of the present invention, the metal catalysts can be disposed between the substrate and the first polycrystalline semiconductor layer.

According to another aspect of the present invention, the metal catalysts can be disposed between the first polycrystalline semiconductor layer and the second polycrystalline semiconductor layer.

According to another aspect of the present invention, the thin film transistor can further comprise a gate electrode disposed on the second polycrystalline semiconductor layer, a source electrode, and a drain electrode, wherein the source electrode and the drain electrode are connected to the second polycrystalline semiconductor layer.

Aspects of the present invention provide a method of manufacturing active layers of a thin film transistor, comprising spraying metal catalysts on a substrate so that the metal catalysts can be spaced apart from one another at specific intervals, forming a first silicon layer, having a first width, on the substrate with the metal catalysts interposed between the first silicon layer and the substrate, forming a second silicon layer, having a second width greater than the first width, on the first silicon layer so that the second silicon layer covers the first silicon layer, forming a first polycrystalline semiconductor layer and a second polycrystalline semiconductor layer by heating the first silicon layer and the second silicon layer, and patterning the first polycrystalline semiconductor layer and the second polycrystalline semiconductor layer so that the first polycrystalline semiconductor layer and the second polycrystalline semiconductor layer have a third width smaller than the first width.

According to another aspect of the present invention, the patterning of the first polycrystalline semiconductor layer and the second polycrystalline semiconductor layer can be performed so that both ends of the first polycrystalline semiconductor layer are removed.

According to another aspect of the present invention, the forming of the first polycrystalline semiconductor layer and the forming of the second polycrystalline semiconductor layer comprises diffusing the metal catalysts into the first silicon layer and the second silicon layer.

According to another aspect of the present invention, the spraying of the metal catalysts can be performed so that the metal catalysts are disposed at a concentration of $10^{12}/cm^2$ to $10^{14}/cm^2$.

Aspects of the present invention provide a method of manufacturing active layers of a thin film transistor, comprising forming a first silicon layer on a substrate, spraying metal catalysts on the first silicon layer so that the metal catalysts can be spaced apart from one another, patterning the first silicon layer so that the first silicon layer has a first width, forming a second silicon layer, having a second width greater than the first width, on the first silicon layer so that the second silicon layer covers the first silicon layer and so that the metal catalysts are interposed between the second silicon layer and the first silicon layer, forming a first polycrystalline semiconductor layer and a second polycrystalline semiconductor layer by heating the first silicon layer and the second silicon layer, and patterning the first polycrystalline semiconductor layer and the second polycrystalline semiconductor layer so that the first polycrystalline semiconductor layer and the second polycrystalline semiconductor layer have a third width smaller than the first width.

According to another aspect of the present invention, the patterning of the first polycrystalline semiconductor layer and the second polycrystalline semiconductor layer can be performed so that both ends of the first polycrystalline semiconductor layer are removed.

According to another aspect of the present invention, the forming of the first polycrystalline semiconductor layer and the second polycrystalline semiconductor layer can be performed by the metal catalysts diffused into the first silicon layer and the second silicon layer.

According to another aspect of the present invention, the spraying of the metal catalysts can be performed so that the metal catalysts are disposed at a concentration of $10^{12}/cm^2$ to $10^{14}/cm^2$.

Aspects of the present invention provide an organic light emitting diode (OLED) display, comprising a substrate, a thin film transistor, comprising a first polycrystalline semiconductor layer disposed on the substrate, a second polycrystalline semiconductor layer disposed on the first polycrystalline semiconductor layer, and metal catalysts configured to adjoin to the first polycrystalline semiconductor layer and spaced apart from one another, and an organic light emitting element, comprising a first electrode connected to the thin film transistor, an organic emission layer disposed on the first electrode, and a second electrode disposed on the organic emission layer.

According to another aspect of the present invention, the first polycrystalline semiconductor layer and the second polycrystalline semiconductor layer can be crystallized using the metal catalysts.

According to another aspect of the present invention, the metal catalysts can be disposed between the substrate and the first polycrystalline semiconductor layer.

According to another aspect of the present invention, the metal catalysts can be disposed between the first polycrystalline semiconductor layer and the second polycrystalline semiconductor layer.

According to another aspect of the present invention, the thin film transistor can further comprise a gate electrode disposed on the second polycrystalline semiconductor layer, a source electrode, and a drain electrode, wherein the source electrode and the drain electrode are connected to the second polycrystalline semiconductor layer. The first electrode can be connected to the drain electrode.

In accordance with aspects of the present invention, there is provided a display device capable of minimizing a voltage drop in an operating power source flowing through an electrode which is a thin film and has a wide area in order to drive the organic emission layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
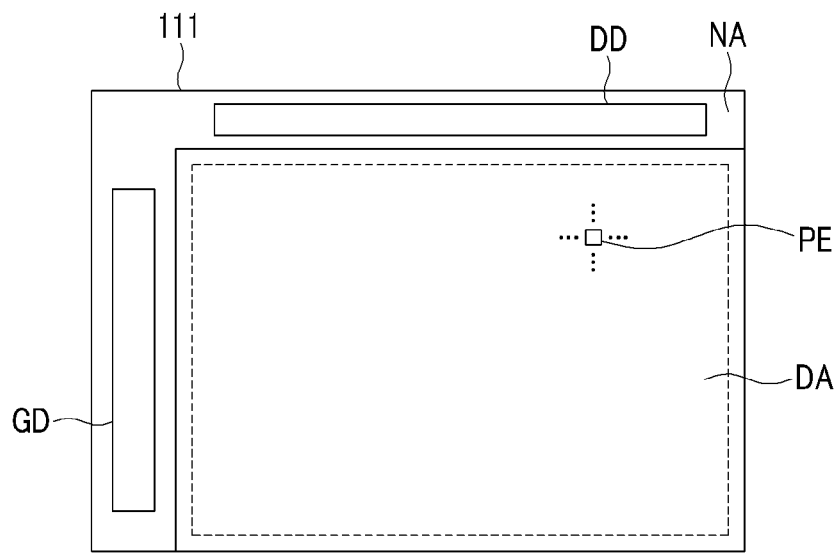
FIG. 1 is a top plan view showing an organic light emitting diode (OLED) display according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that one element, film or layer is "formed on" or "disposed on" a second element, layer or film, the first element, layer or film may be formed or disposed directly on the second element, layer or film or there may be intervening element, layers or films between the first element, layer or film and the second element, layer or film. Further, as used herein, the term "formed on" is used with the same meaning as "located on" or "disposed on" and is not meant to be limiting regarding any particular fabrication process. Furthermore, the size and thickness of each of the elements shown in the drawings is arbitrarily shown for better understanding and ease of description, and aspects of the present invention are not limited thereto.

Hereinafter, an organic light emitting diode (OLED) display 101 according to an exemplary embodiment is described with reference to FIGS. 1 to 5. Although, for example, the organic light emitting diode (OLED) display 101 is described as a display device according to the present exemplary embodiment, a display device according to another exemplary embodiment can be a liquid crystal display (LCD) including a thin film transistor. Further, a first polycrystalline semiconductor layer and a second polycrystalline semiconductor layer described later form the active layers of a thin film transistor.

FIG. 1 is a top plan view showing the organic light emitting diode (OLED) display 101 according to the present exemplary embodiment. As shown in FIG. 1, the organic light emitting diode (OLED) display 101 includes a substrate 111 divided into a display area DA and a non-display area NA. Pixel areas PE are formed in the display area DA of the substrate 111 to display an image. One or more driving circuits GD and DD are formed in the non-display area NA. Here, the pixel areas PE are an area in which pixels, which are a minimum unit to display an image, are formed. However, in the organic light emitting diode (OLED) display according to the present exemplary embodiment, all the driving circuits GD and DD need not be formed in the non-display area NA, and part of or all the driving circuits GD and DD may be omitted.

Figure 2:
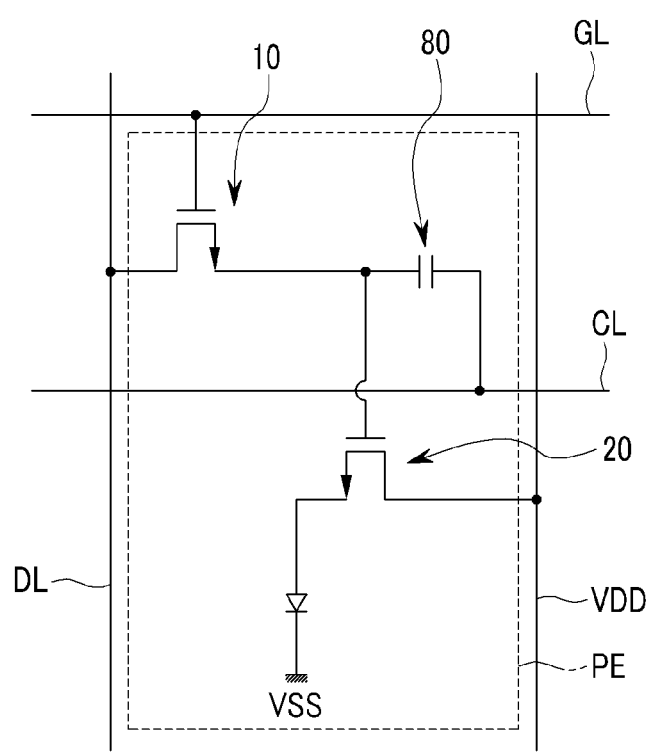
FIG. 2 is a circuit diagram of a pixel circuit included in the organic light emitting diode (OLED) display shown in FIG. 1.

FIG. 2 is a circuit diagram of a pixel circuit included in the organic light emitting diode (OLED) display shown in FIG. 1.

As shown in FIG. 2, the organic light emitting diode (OLED) display 101, according to the present exemplary embodiment, has a 2Tr-1 Cap structure in which an organic light emitting element 70, two thin film transistors (TFT) 10 and 20, and one capacitor 80 are disposed in each pixel area PE. However, aspects of the present invention are not limited thereto, and the organic light emitting diode (OLED) display 101 may have other suitable structures. For example, the organic light emitting diode (OLED) display can have a structure in which three or more thin film transistors or two or more capacitors are disposed in each pixel area PE or may be formed to have a variety of structures including additional wires.

Figure 3:
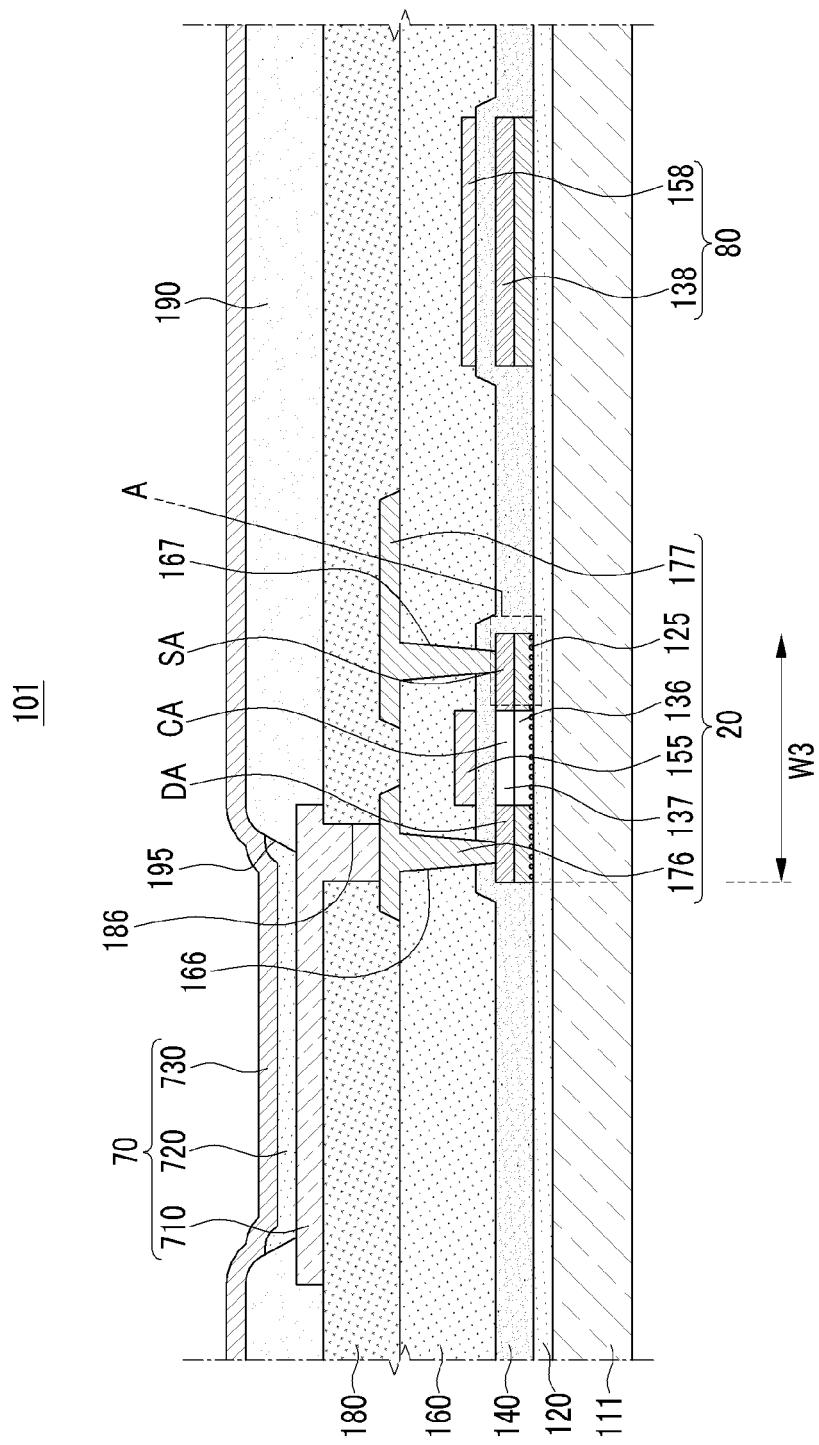
FIG. 3 is an enlarged cross-sectional view showing a part of the organic light emitting diode (OLED) display shown in FIG. 1.

One or more of the thin film transistors and capacitors additionally formed as described above can become the constituent elements of a compensation circuit. The compensation circuit functions to suppress a deviation in the display quality by improving the uniformity of the organic light emitting element 70 formed in each pixel area PE. In general, the compensation circuit can include two through eight thin film transistors. Further, the driving circuits GD and DD (shown in FIG. 1) formed on the non-display area NA of the substrate 111 can also include additional thin film transistors. The organic light emitting element 70, as shown in FIG. 3, includes an anode electrode (i.e., a hole injection electrode), a cathode electrode (i.e., an electron injection electrode), and an organic emission layer disposed between the anode and the cathode.

More particularly, the organic light emitting diode (OLED) display 101, according to the present exemplary embodiment, includes the first thin film transistor 10 and the second thin film transistor 20 in each pixel area PE. Each of the first thin film transistor 10 and the second thin film transistor 20 includes a gate electrode, a first polycrystalline semiconductor layer, a second polycrystalline semiconductor layer, a source electrode, and a drain electrode.

FIG. 2 illustrates a capacitor line CL together with a gate line GL, a data line DL, and a common power source line VDD. However, aspects of the present invention are not limited thereto, and the organic light emitting diode (OLED) display may have suitable structures other than the structure shown in FIG. 2. Accordingly, the capacitor line CL may be omitted according to circumstances.

The source electrode of the first thin film transistor 10 is connected to the data line DL, and the gate electrode of the first thin film transistor 10 is connected to the gate line GL. The drain electrode of the first thin film transistor 10 is connected to the capacitor line CL via the capacitor 80. Further, a node is formed between the capacitor 80 and the drain electrode of the first thin film transistor 10. The gate electrode of the second thin film transistor 20 is connected to the node. In addition, the common power source line VDD is connected to the source electrode of the second thin film transistor 20, and the anode of the organic light emitting element 70 is connected to the drain electrode of the second thin film transistor 20.

The first thin film transistor 10 is used as a switch for selecting a pixel area PE which will be light-emitted. When the first thin film transistors 10 are sequentially turned on, the capacitors 80 are charged. Here, the amount of charge is proportional to the potential of voltage supplied through the data line DL. Further, when a signal having voltage increased in a cycle of one frame is inputted to the capacitor line CL while the first thin film transistor 10 is turned off, the gate potential of the second thin film transistor 20 rises. The rise of the gate potential of the second thin film transistor 20 is in response to the level of voltage which is supplied through the capacitor line CL on the basis of the potential charged in the capacitor 80. Further, when the gate potential is higher than a threshold voltage, the second thin film transistor 20 is turned on. In response thereto, the voltage supplied to the common power source line VDD is supplied to the organic light emitting element 70 via the second thin film transistor 20, and so the organic light emitting element 70 emits light. However, aspects of the present invention are not limited to the above construction of the pixel area PE, which can be modified in various ways within the scope which can be easily modified by those skilled in the art.

Hereinafter, the organic light emitting diode (OLED) display 101 according to the present exemplary embodiment is described with respect to an order of stacking of structures of the second thin film transistor 20 and capacitor 80 with reference to FIGS. 3 and 4. It is hereinafter assumed that the second thin film transistor 20 is a thin film transistor.

FIG. 3 is an enlarged cross-sectional view showing a part of the organic light emitting diode (OLED) display shown in FIG. 1. FIG. 4 is an enlarged view of a portion 'A' in FIG. 3. As shown in FIG. 3, the substrate 111 is formed of an insulating substrate made of glass, ceramics, or plastic or the like. However, aspects of the present invention are not limited thereto and the substrate 111 can be formed of a metallic substrate made of stainless steel or the like.

A buffer layer 120 is formed on the substrate 111. For example, the buffer layer 120 can be formed of a single layer made of silicon nitride (SiNx) or can have a multilayer structure in which silicon nitride (SiNx) and silicon oxide (SiOx) are stacked. The buffer layer 120 functions to prevent the infiltration of unnecessary components, such as impurity elements or moisture, and also to planarize a surface. However, aspects of the present invention are not limited thereto and the buffer layer 120 may be omitted according to the types and process conditions of the substrate 111.

Figure 4:
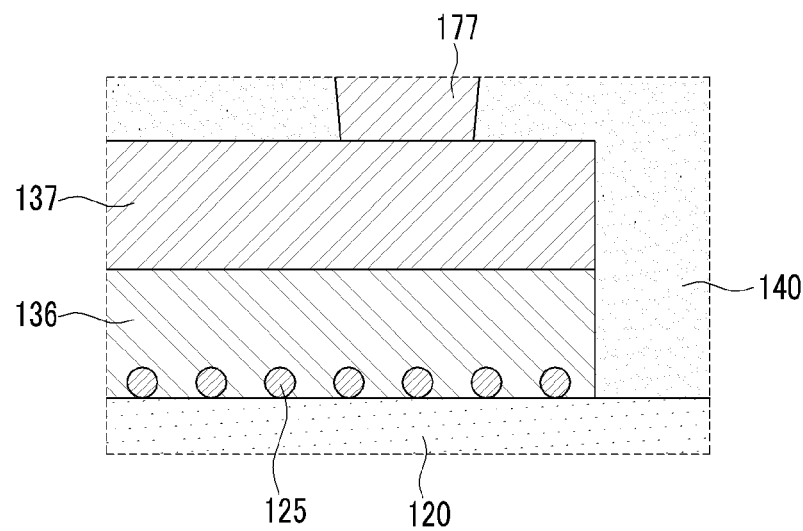
FIG. 4 is an enlarged view of a portion 'A' in FIG. 3.

As shown in FIGS. 3 and 4, metal catalysts 125 are placed on the buffer layer 120.

The metal catalysts 125 are placed between the buffer layer 120 and a first polycrystalline semiconductor layer 136, or in other words, between the substrate 111 and the first polycrystalline semiconductor layer 136. That is, the metal catalysts 125 neighbor to the first polycrystalline semiconductor layer 136. The metal catalysts 125 are spaced apart from one another at predetermined intervals. The metal catalysts 125 are placed on the buffer layer 120 in a molecular unit as the smallest unit. The metal catalysts 125 include one or more of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). From among them, the metal catalysts 125 preferably include nickel (Ni). Nickel disilicide (NiSi$_2$) having nickel (Ni) and silicon (Si) combined therein effectively accelerates the growth of silicon crystals. However, aspects of the present invention are not limited thereto and the metal catalysts may include other suitable materials.

The first polycrystalline semiconductor layer 136 is disposed on the buffer layer 120 with the metal catalysts 125 interposed therebetween. A second polycrystalline semiconductor layer 137 is formed on the first polycrystalline semiconductor layer 136. The first polycrystalline semiconductor layer 136 has a thickness which is 0.3 to 3 times a thickness of the second polycrystalline semiconductor layer 137. More particularly, the first polycrystalline semiconductor layer 136 and the second polycrystalline semiconductor layer 137 have a thickness of 10 nm to 200 nm. The thickness of the first polycrystalline semiconductor layer 136 is 0.3 to 3 times the thickness of the second polycrystalline semiconductor layer 137 while remaining within a thickness range of 10 nm to 200 nm. Particularly, if the thickness of the first polycrystalline semiconductor layer 136 and the second polycrystalline semiconductor layer 137 is less than 10 nm, a problem can occur in the uniformity of the thickness of each of the first polycrystalline semiconductor layer 136 and the second polycrystalline semiconductor layer 137. If the thickness of the first polycrystalline semiconductor layer 136 and the second polycrystalline semiconductor layer 137 is more than 200 nm, the entire thickness of the second thin film transistor 20 is increased. Consequently, there may be a problem in that the entire thickness of the organic light emitting diode (OLED) display 101 is increased.

The first polycrystalline semiconductor layer 136 and the second polycrystalline semiconductor layer 137 have a third width W3, which is described later. The first polycrystalline semiconductor layer 136 and the second polycrystalline semiconductor layer 137 are crystallized using the metal catalysts 125 disposed between the buffer layer 120 and the first polycrystalline semiconductor layer 136. In a method of crystallizing the first polycrystalline semiconductor layer 136 and the second polycrystalline semiconductor layer 137, an amorphous silicon layer is crystallized within a relatively short time at a relatively low temperature. For example, a process of crystallizing the amorphous silicon layer using nickel (Ni) as the metal catalysts 125 is described below. Nickel (Ni) is diffused into the amorphous silicon layer and combined with silicon (Si) of the amorphous silicon layer, thus becoming nickel disilicide (NiSi2). The nickel disilicide (NiSi$_2$) becomes a seed, and crystals are grown around the seed within the amorphous silicon layer. Accordingly, the amorphous silicon layer is grown into a polysilicon layer, or in other words, a polycrystalline semiconductor layer.

A grain size of each of the first polycrystalline semiconductor layer 136 and the second polycrystalline semiconductor layer 137 crystallized through the metal catalysts 125 is several tens of μm and is greater than the grain size of a polycrystalline semiconductor layer which is formed using a common crystallization (for example, crystallization using a laser) process. Furthermore, a plurality of sub-grain boundaries exists within one grain boundary. Accordingly, a deterioration of a uniformity of the crystallization can be minimized by the grain boundaries.

A case in which the metal catalysts 125 are disposed under the amorphous silicon layer is advantageous in that the grain boundary is more indistinct and defects within the grains are further reduced, as compared with a case in which the metal catalysts 125 are disposed on the amorphous silicon layer. In the organic light emitting diode (OLED) display 101 according to the present exemplary embodiment, the metal catalysts 125 are disposed between the first polycrystalline semiconductor layer 136 and the substrate 111 under the first polycrystalline semiconductor layer 136. Accordingly, the grain boundary constituting each of the first polycrystalline semiconductor layer 136 and the second polycrystalline semiconductor layer 137 becomes indistinct, and defects within the grains are further reduced. Consequently, an electron mobility within the first polycrystalline semiconductor layer 136 and the second polycrystalline semiconductor layer 137 is high. Thus, the semiconductor characteristic of the thin film transistor 20 constituting the organic light emitting diode (OLED) display 101 can be improved, which improves a display quality of the organic light emitting diode (OLED) display 101.

Figure 5:
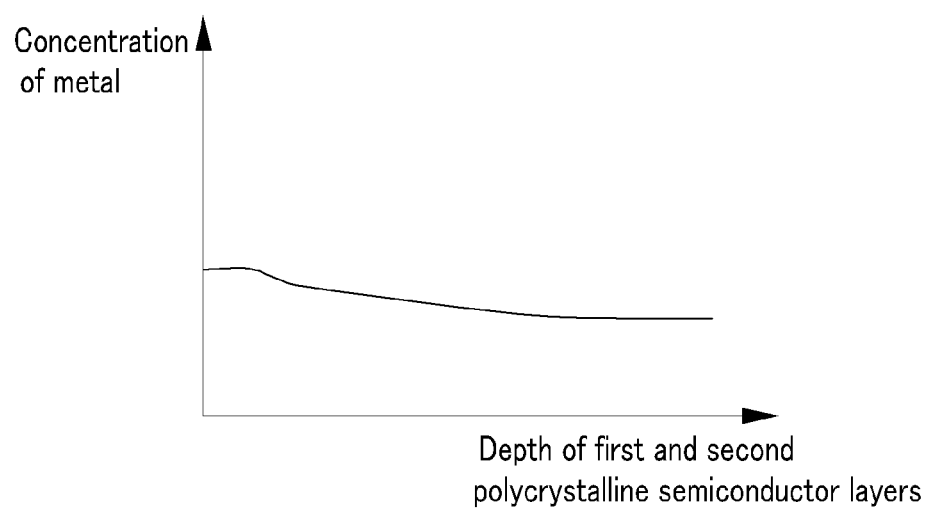
FIG. 5 is a graph showing a concentration of a metal catalyst according to a depth of first and second polycrystalline semiconductor layers shown in FIG. 3.

Typically, a polycrystalline semiconductor layer crystallized using metal catalysts has a high leakage current because metallic components remain within the polycrystalline semiconductor layer. However, the thin film transistor 20 included in the organic light emitting diode (OLED) display 101 according to the present exemplary embodiment has a low leakage current because a relatively small amount of metallic components remain within the first polycrystalline semiconductor layer 136 and the second polycrystalline semiconductor layer 137. FIG. 5 is a graph showing a concentration of metal according to a depth of the first and second polycrystalline semiconductor layers shown in FIG. 3.

As shown in FIG. 5, the first polycrystalline semiconductor layer 136 and the second polycrystalline semiconductor layer 137 have a low metal concentration according to the depth of the polycrystalline semiconductor layers. Particularly, the first polycrystalline semiconductor layer 136 and the second polycrystalline semiconductor layer 137 have a thickness of 10 nm to 200 nm. The second polycrystalline semiconductor layer 137 and the first polycrystalline semiconductor layer 136 have a low metal concentration. The reason why the first polycrystalline semiconductor layer 136 and the second polycrystalline semiconductor layer 137 have a low metal concentration is described later in connection with a method of manufacturing the thin film transistor.

With reference to FIG. 3, a first capacitor electrode 138 is disposed on the buffer layer 120 separated from the first polycrystalline semiconductor layer 136 and the second polycrystalline semiconductor layer 137. That is, the first polycrystalline semiconductor layer 136, the second polycrystalline semiconductor layer 137, and the first capacitor electrode 138 are formed in the same layer. Each of the first polycrystalline semiconductor layer 136, the second polycrystalline semiconductor layer 137, and the first capacitor electrode 138 includes a polysilicon layer doped with impurities.

More particularly, the first polycrystalline semiconductor layer 136 and the second polycrystalline semiconductor layer 137 are both divided into a channel area CA, a source area SA and a drain area DA. The source area SA and the drain area DA are formed on respective sides of the channel area CA. The channel area CA of the first polycrystalline semiconductor layer 136 and the second polycrystalline semiconductor layer 137 is an intrinsic semiconductor, such as a polysilicon layer not doped with impurities. The source area SA and the drain area DA of the first polycrystalline semiconductor layer 136 and the second polycrystalline semiconductor layer 137 are an impurity semiconductor, such as a polysilicon layer doped with impurities. Further, the first capacitor electrode 138 is formed of a polysilicon layer which is doped with impurities substantially in the same manner as the source area SA and the drain area DA of the first polycrystalline semiconductor layer 136 and the second polycrystalline semiconductor layer 137. In other words, the first capacitor electrode 138 is formed at the same time when the source area SA and the drain area DA of the first polycrystalline semiconductor layer 136 and the second polycrystalline semiconductor layer 137 are formed.

A gate insulating layer 140 is disposed on the first polycrystalline semiconductor layer 136, the second polycrystalline semiconductor layer 137, and the first capacitor electrode 138. The gate insulating layer 140 is made of one or more of tetra ethyl ortho silicate (TEOS), silicon nitride (SiNx), and silicon oxide ($SiO_2$). However, aspects of the present invention are not limited thereto, and the gate insulating layer 140 may be made of other suitable materials.

A gate electrode 155 and a second capacitor electrode 158 are formed on the gate insulating layer 140. The gate electrode 155 and the second capacitor electrode 158 are formed in the same layer and are made of substantially the same metallic material. The metallic material includes one or more of molybdenum (Mo), chromium (Cr), and tungsten (W). For example, the gate electrode 155 and the second capacitor electrode 158 can be made of an alloy including molybdenum (Mo). However, aspects of the present invention are not limited thereto, and the gate electrode 155 and the second capacitor electrode 158 may be formed of other suitable materials.

The gate electrode 155 is disposed on the second polycrystalline semiconductor layer 137 so that it overlaps with the channel area CA of the first polycrystalline semiconductor layer 136 and the second polycrystalline semiconductor layer 137. The gate electrode 155 excludes impurities from being doped into the channel area CA when the impurities are doped into the source area SA and the drain area DA of the first polycrystalline semiconductor layer 136 and the second polycrystalline semiconductor layer 137 in the process of forming the first polycrystalline semiconductor layer 136 and the second polycrystalline semiconductor layer 137.

The second capacitor electrode 158 is formed on the first capacitor electrode 138, and has a thickness less than the gate electrode 155. Accordingly, impurities pass through the second capacitor electrode 158 and are doped into the first capacitor electrode 138. As described above, the second capacitor electrode 158 is disposed on the first capacitor electrode 138 with the gate insulating layer 140 interposed therebetween, thereby forming the capacitor 80. The gate insulating layer 140 is a dielectric material of the capacitor 80.

An interlayer insulating layer 160 is formed on the gate electrode 155 and the second capacitor electrode 158. The interlayer insulating layer 160, like the gate insulating layer 140, is formed of tetra ethyl ortho silicate (TEOS), silicon nitride (SiNx), silicon oxide ($SiO_2$) or the like. However, aspects of the present invention are not limited thereto and the interlayer insulating layer 160 and the gate insulating layer 140 may be formed of other suitable materials. Both the interlayer insulating layer 160 and the gate insulating layer 140 have a source contact hole 167 and a drain contact hole 166. The source contact hole 167 and the drain contact hole 166 respectively expose part of the source area SA and part of the drain area DA, of the second polycrystalline semiconductor layer 137.

A source electrode 177 and a drain electrode 176 are formed on the interlayer insulating layer 160. The source electrode 177 contacts the source are SA of the second polycrystalline semiconductor layer 137 through the source contact hole 167. The drain electrode 176 contacts the drain area DA of the second polycrystalline semiconductor layer 137 through the drain electrode hole 166. The source electrode 177 and the drain electrode 167 are spaced apart from one another. Accordingly, the thin film transistor 20 included in the organic light emitting diode (OLED) display 101 according to the present exemplary embodiment is formed.

Furthermore, although not shown, additional capacitor electrodes, made of a same material and formed in a same layer as source electrode 177 and the drain electrode 176, can be disposed on the interlayer insulating layer 160. The additional capacitors can be formed to overlap with at least one of the first capacitor electrode 138 and the second capacitor electrode 158. In the case described above, having additional capacitor electrodes, the capacitor 80 has a dual structure, thereby further improving the charge capacity of the capacitor 80.

A planarization layer 180, covering the source electrode 177 and the drain electrode 176, is formed on the interlayer insulating layer 160. The planarization layer 180 functions to remove a step, or in other words, an unevenness of a surface, and perform planarization in order to increase a luminous efficiency of the organic light emitting element 70 to be formed thereon. The planarization layer 180 has an anode contact hole 186 exposing part of the drain electrode 176. The planarization layer 180 is made of at least one of materials including polyacrylates resin, epoxy resin, phenolic resin, polyamides resin, polyimides rein, unsaturated polyesters resin, poly(phenylenethers) resin, poly(phenylenesulfides) resin, and benzocyclobutene (BCB). However, aspects of the present invention are not limited thereto, and the planarization layer 180 may be formed of other suitable materials.

A first OLED electrode 710 is disposed on the planarization layer 180. Here, the first OLED electrode 710 is an anode. The first OLED electrode 710 is connected to the drain electrode 176 through the anode contact hole 186 of the planarization layer 180. A pixel definition film 190, having an opening 195 exposing the first OLED electrode 710, is formed on the planarization layer 180. That is, the first OLED electrode 710 is disposed to correspond to the opening 195 of the pixel definition film 190. The pixel definition film 190 is made of resin, such as polyacrylates or polyimides, silica-based inorganic matter or the like.

An organic emission layer 720 is formed on the first OLED electrode 710 within the opening 195 of the pixel definition film 190. A second OLED electrode 730 is formed on the pixel definition film 190 and the organic emission layer 720. Here, the second OLED electrode 730 is a cathode. However, aspects of the present invention are not limited thereto, and the first OLED electrode 710 and the second OLED electrode 730 may be reversed in polarity. As described above, the organic light emitting element 70, including the first OLED electrode 710, the organic emission layer 720, and the second OLED electrode 730, is formed.

The organic light emitting diode (OLED) display 101 can have a structure of a top-emission type, a bottom-emission type, or a dual-emission type with respect to a direction in which the organic light emitting element 70 emits light. In a case in which the organic light emitting diode (OLED) display 101 is the top-emission type, the first OLED electrode 710 is formed as a reflective layer, and the second OLED electrode 730 is formed as a semi-transparent film. Meanwhile, in a case in which the organic display device 101 is the bottom-emission type, the first OLED electrode 710 is formed of a semi-transparent film, and the second OLED electrode 730 is formed of a reflective layer. Furthermore, in a case in which the organic display device 101 is the dual-emission type, the first OLED electrode 710 and the second OLED electrode 730 are both formed of a transparent layer or a semi-transparent film.

The reflective layer and the semi-transparent film are made of at least one of metal, including magnesium (Mg), silver (Ag), gold (Au), calcium (Ca), lithium (Li), chromium (Cr), and aluminum (Al), and an alloy of them. The reflective layer and the semi-transparent film can be determined by a thickness of the respective layers. In general, the semi-transparent film has a thickness of 200 nm or less. The semi-transparent film has a higher transmittance of light with a reduction in the thickness, but has a low transmittance of light with an increase in the thickness. The transparent layer can be made of materials, such as Indium Tin Oxide (IT)), Indium Zinc Oxide (IZO), zinc oxide (ZnO), or Indium Oxide ($In_2O_3$). However, aspects of the present invention are not limited thereto, and the transparent layer may be made of other suitable materials.

Further, the organic emission layer 720 has a multilayer structure, including an emission layer and one or more of a hole injection layer (HIL), a hole transport layer (HTL), an electron transport layer (ETL), and an electron injection layer (EIL). In a case in which the organic emission layer 720 includes all of them, the hole injection layer (HIL) is disposed on the first OLED electrode 710, which is the anode, and the hole transport layer (HTL), the emission layer, the electron transport layer (ETL), and the electron injection layer (EIL) are sequentially stacked on the hole injection layer (HIL). However, aspects of the present invention are not limited thereto and the organic emission layer 720 may further include another layer according to circumstances.

As described above, in the thin film transistor 20 included in the organic light emitting diode (OLED) display 101 according to the present exemplary embodiment, the first polycrystalline semiconductor layer 136 and the second polycrystalline semiconductor layer 137, constituting the thin film transistor 20, are crystallized using the metal catalysts 125. Accordingly, the electron mobility of the first polycrystalline semiconductor layer 136 and the second polycrystalline semiconductor layer 137 is high. Thus, the semiconductor characteristic of the thin film transistor 20 can be improved. Consequently, the organic light emitting diode (OLED) display 101 including the thin film transistor 20 can have an improved display quality.

Furthermore, in the thin film transistor 20 of the organic light emitting diode (OLED) display 101 according to the present exemplary embodiment, the first polycrystalline semiconductor layer 136 and the second polycrystalline semiconductor layer 137 are illustrated to be crystallized using the metal catalysts 125. However, since a relatively small amount of metallic components remains in the first polycrystalline semiconductor layer 136 and the second polycrystalline semiconductor layer 137, a deterioration of the semiconductor characteristic of the thin film transistor 20 can be minimized. Accordingly, a deterioration of the display quality of the organic light emitting diode (OLED) display 101 including the thin film transistor 20 can be minimized.

Figure 6:
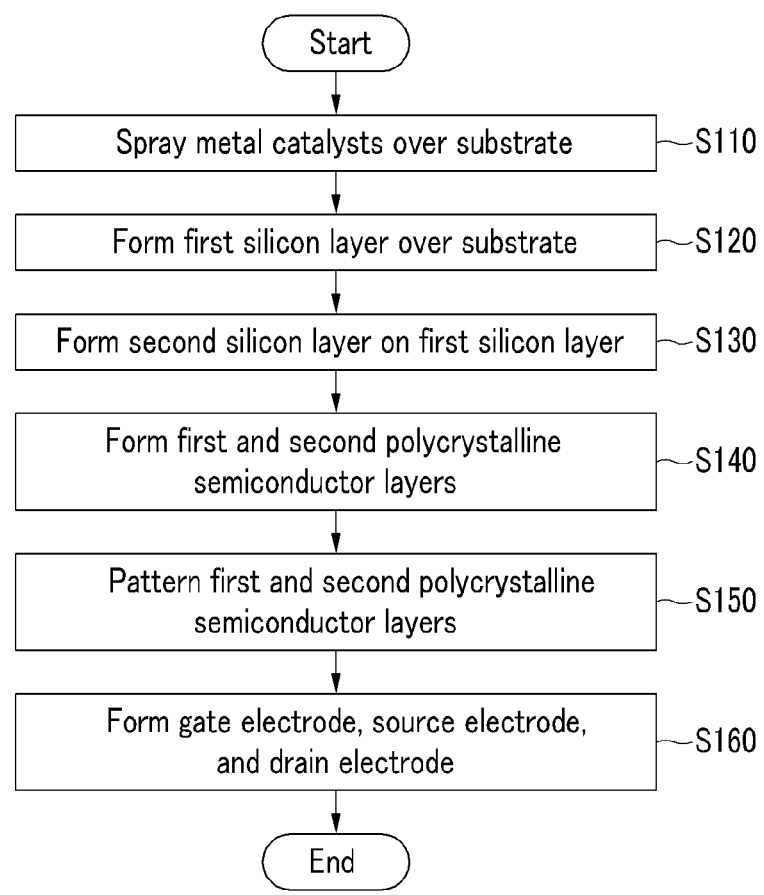
FIG. 6 is a flowchart illustrating a method of manufacturing a thin film transistor according to an exemplary embodiment.

Hereinafter, a method of manufacturing a thin film transistor 20 according to a second exemplary embodiment is described with reference to FIGS. 6 to 13. FIG. 6 is a flowchart illustrating the method of manufacturing the thin film transistor according to the second exemplary embodiment. FIGS. 7 to 13 are diagrams illustrating the method of manufacturing the thin film transistor according to the second exemplary embodiment.

Figure 7:
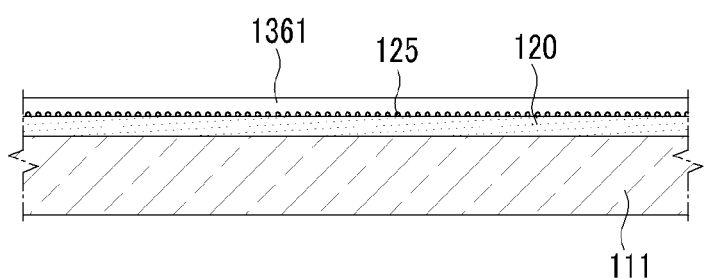
FIGS. 7 to 13 are diagrams illustrating the method of manufacturing the thin film transistor according to the exemplary embodiment of FIG. 6.

First, as shown in FIGS. 6 and 7, metal catalysts 125 are sprayed on a substrate 111 at predetermined intervals at step S110. More particularly, a buffer layer 120 is formed on the insulating substrate 111. The metal catalysts 125 are sprayed on the buffer layer 120 so that the metal catalysts are spaced apart from one another at specific intervals. The metal catalysts 125 are disposed on the buffer layer 120 at a concentration of $10^{12}/cm^2$ to $10^{14}/cm^2$. The metal catalysts 125 include one or more of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). Nickel (Ni) is preferably used as the metal catalysts 125. However, aspects of the present invention are not limited thereto, and other suitable materials may be used as the metal catalysts 125. The metal catalysts 125 are disposed on the buffer layer 120 in a molecular unit as the smallest unit.

Figure 8:
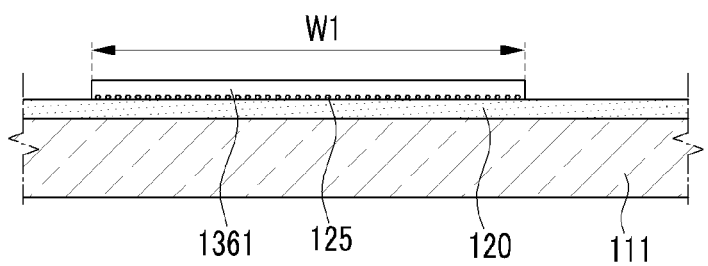

With reference to FIG. 6, and as shown in FIGS. 7 and 8, a first silicon layer 1361 having a first width W1 is formed on the substrate 111 with the metal catalysts 125 interposed therebetween in operation S120. More particularly, the first silicon layer 1361 is formed on the substrate 111 with the metal catalysts 125 interposed therebetween. The first silicon layer 1361 is patterned using a microelectromechanical systems (MEMS) technique, such as a photolithography process, so that the first silicon layer 1361 has the first width W1. The first silicon layer 1361 includes amorphous silicon.

Figure 9:
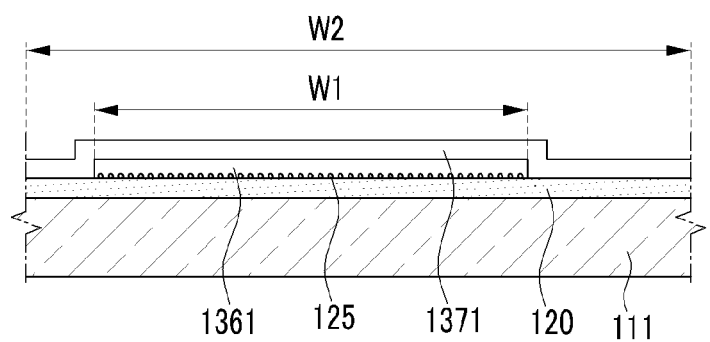

Next, as shown in FIG. 9, a second silicon layer 1371, having a second width W2 greater than the first width W1, is formed on the first silicon layer 1361 so that it covers the first silicon layer 1361 in operation S130. More particularly, the second silicon layer 1371, having the second width, is formed on the first silicon layer 1361 having the first width W1 so that the second silicon layer 1371 covers the first silicon layer 1361. The second silicon layer 1371 includes amorphous silicon.

Figure 10:
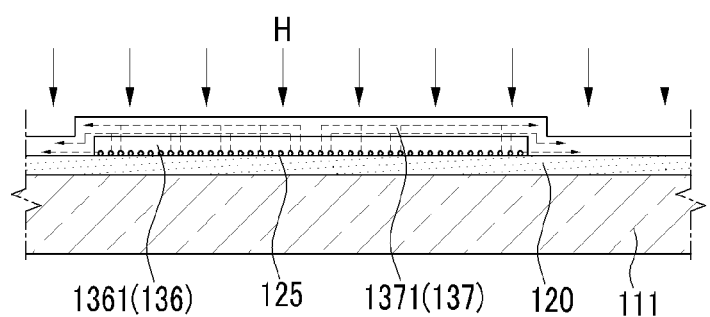

Next, as shown in FIG. 10, the first silicon layer 1361 is formed into the first polycrystalline semiconductor layer 136 and the second silicon layer 1371 is formed into the second polycrystalline semiconductor layer 137, by heating the first silicon layer 1361 and the second silicon layer 1371 in operation S140.

More particularly, the first silicon layer 1361 and the second silicon layer 1371 are heated (H) in a temperature range of 600° C. to 700° C. The heating (H) is performed for 10 minutes to 20 hours. If the first silicon layer 1361 and the second silicon layer 1371 are heated at a temperature of less than 600° C., the first silicon layer 1361 and the second silicon layer 1371 may not be fully crystallized. If the first silicon layer 1361 and the second silicon layer 1371 are heated at a temperature of more than 700° C., the substrate 111 may be deformed by heat. When the first silicon layer 1361 and the second silicon layer 1371 are heated, the metal catalysts 125 disposed between the buffer layer 120 and the first silicon layer 1361 are diffused. The diffusion of the metal catalysts 125 is performed from a portion between the substrate 111 and the first silicon layer 1361 and extends towards both ends of the second silicon layer 1371 via the first silicon layer 1361 in the direction of arrows indicated in FIG. 10.

If nickel (Ni) is used as the metal catalysts 125, the metal catalysts 125 are diffused and the nickel (Ni) is combined with the silicon (Si) of the first silicon layer 1361 and the second silicon layer 1371. Accordingly, nickel disilicide ($NiSi_2$) is formed within the first silicon layer 1361 and the second silicon layer 1371. The nickel disilicide ($NiSi_2$) formed within the first silicon layer 1361 and the second silicon layer 1371 becomes a seed. Crystals are grown around the seed within the first silicon layer 1361 and the second silicon layer 1371. Consequently, the first silicon layer 1361 is formed into the first polycrystalline semiconductor layer 136, and the second silicon layer 1371 is formed into the second polycrystalline semiconductor layer 137.

Figure 11:
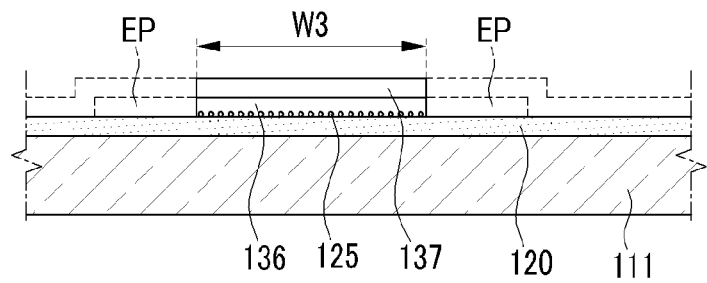

Next, as shown in FIG. 11, the first polycrystalline semiconductor layer 136 and the second polycrystalline semiconductor layer 137 are patterned so that they have a third width W3 smaller than the first width W1 in operation S150. More particularly, the first polycrystalline semiconductor layer 136 and the second polycrystalline semiconductor layer 137 are patterned using a microelectromechanical systems (MEMS) technique, such as a photolithography process, so that they have the third width W3 smaller than the first width W1 of the first polycrystalline semiconductor layer 136. When the first polycrystalline semiconductor layer 136 and the second polycrystalline semiconductor layer 137 are patterned, both ends EP of the first polycrystalline semiconductor layer 136 are removed. The both ends EP of the first polycrystalline semiconductor layer 136 have a width which is more than 0% to less than 50% of the first width W1 of the first polycrystalline semiconductor layer 136.

That is, since the first polycrystalline semiconductor layer 136 and the second polycrystalline semiconductor layer 137 are patterned to have the third width W3, an interface between the second polycrystalline semiconductor layer 137 and both ends EP of the first polycrystalline semiconductor layer 136 is removed. As described above, the first polycrystalline semiconductor layer 136 and the second polycrystalline semiconductor layer 137 are patterned so that the interface between the second polycrystalline semiconductor layer 137 and both ends EP of the first polycrystalline semiconductor layer 136 is removed. Accordingly, the amount of metallic components remaining within the first polycrystalline semiconductor layer 136 and the second polycrystalline semiconductor layer 137 is relatively reduced. This is because the metal catalysts 125 between the buffer layer 120 and the first silicon layer 1361 are diffused from a first location towards both ends of the second silicon layer 1371 via the first silicon layer 1361, as is shown in FIG. 10.

More particularly, when the first polycrystalline semiconductor layer 136 and the second polycrystalline semiconductor layer 137 are formed while the metal catalysts 125 are diffused, the metallic components of the metal catalysts 125 remain at the interface between the second polycrystalline semiconductor layer 137 and both ends EP of the first polycrystalline semiconductor layer 136. Here, the interface between the second polycrystalline semiconductor layer 137 and both ends EP of the first polycrystalline semiconductor layer 136 is removed by the patterning of the first polycrystalline semiconductor layer 136 and the second polycrystalline semiconductor layer 137. Accordingly, the amount of metallic components remaining within the first polycrystalline semiconductor layer 136 and the second polycrystalline semiconductor layer 137 is relatively reduced because they are removed during the patterning.

Furthermore, the amount of remaining metallic components is relatively higher at a portion where the diffusion of the metal catalysts 125 is ended. The diffusion of the metal catalysts 125 is performed from a portion between the buffer layer 120 and the first polycrystalline semiconductor layer 136 towards both ends of the second polycrystalline semiconductor layer 137 via the first polycrystalline semiconductor layer 136. Accordingly, the portion where the diffusion of the metal catalysts 125 is ended is both ends of the second polycrystalline semiconductor layer 137. However, the first polycrystalline semiconductor layer 136 and the second polycrystalline semiconductor layer 137 are patterned so that both ends of the first polycrystalline semiconductor layer 136 are removed. Consequently, both ends EP of the second polycrystalline semiconductor layer 137 are also removed.

In other words, both ends of the second polycrystalline semiconductor layer 137, in which a large amount of metallic components remain, are removed by the patterning of the first polycrystalline semiconductor layer 136 and the second polycrystalline semiconductor layer 137. Accordingly, only portions of the first polycrystalline semiconductor layer 136 and the second polycrystalline semiconductor layer 137 in which a relatively small amount of metallic components remains are left. Consequently, the amount of metallic components remaining within the first polycrystalline semiconductor layer 136 and the second polycrystalline semiconductor layer 137 is relatively reduced.

Figure 12A:
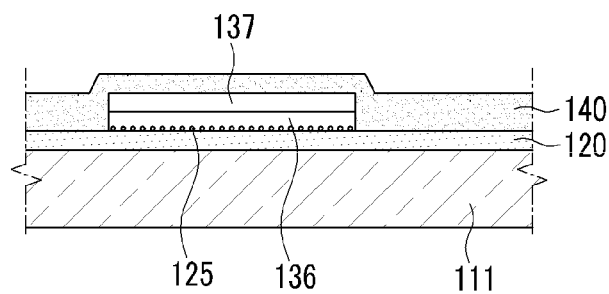
Figure 12B:
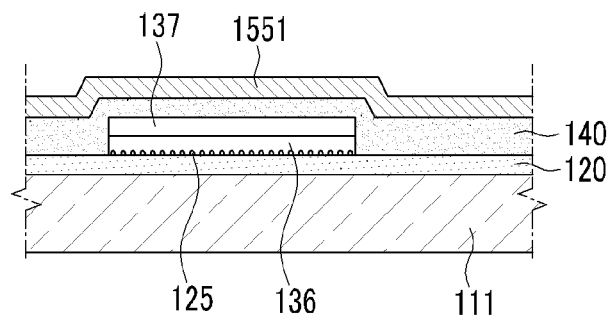
Figure 12C:
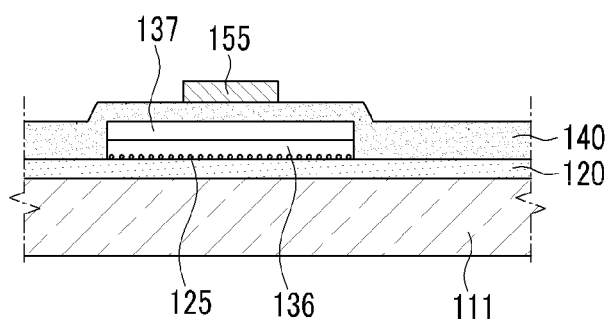

Next, the gate electrode 155, the source electrode 177, and the drain electrode 176 are formed as shown in FIGS. 12A to 13C. More particularly, as shown in FIG. 12A, the gate insulating layer 140 is formed on the second polycrystalline semiconductor layer 137. As shown in FIG. 12B, a gate metal layer 1551 is formed on the gate insulating layer 140. As shown in FIG. 12C, the gate electrode 155 is formed by patterning the gate metal layer 1551 using a microelectromechanical systems (MEMS) technique, such as a photolithography process.

Figure 13A:
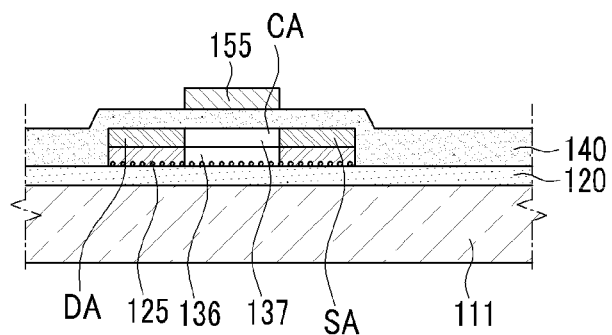
Figure 13B:
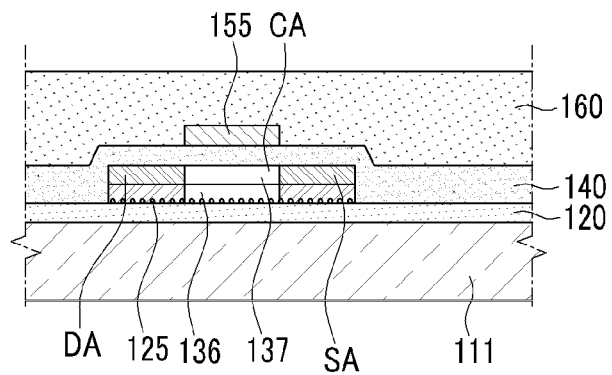

Next, as shown in FIG. 13A, the source area SA, the channel area CA, and the drain area DA are formed in both the first polycrystalline semiconductor layer 136 and the second polycrystalline semiconductor layer 137 by doping impurities into both the first polycrystalline semiconductor layer 136 and the second polycrystalline semiconductor layer 137. The gate electrode 155 is used as a mask. Accordingly, the first polycrystalline semiconductor layer 136 and the second polycrystalline semiconductor layer 137, corresponding to the channel area CA, become an intrinsic semiconductor. The first polycrystalline semiconductor layer 136 and the second polycrystalline semiconductor layer 137, corresponding to the source area SA and the drain area DA, become an impurity semiconductor. Next, as shown in FIG. 13B, the interlayer insulating layer 160 is formed on the gate electrode 155.

Figure 13C:
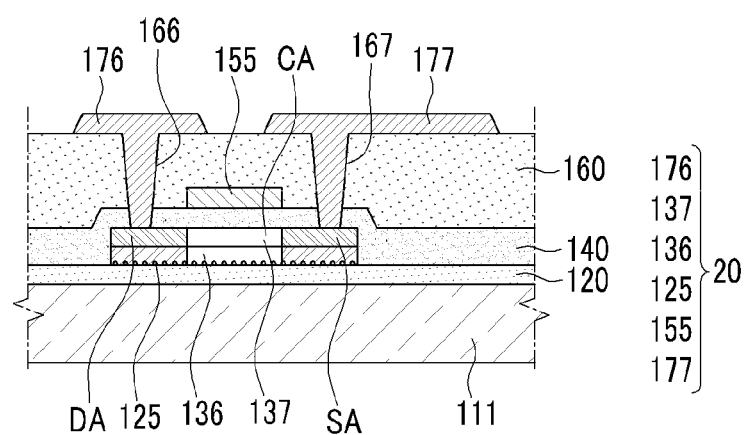

As shown in FIG. 13C, the source contact hole 167 and the drain contact hole 166 respectively exposing part of the source area SA and part of the drain area DA, are formed by patterning the interlayer insulating layer 160 and the gate insulating layer 140 at the same time using a microelectromechanical systems (MEMS) technique, such as a photolithography process. Thereafter, the source electrode 177 and the drain electrode 176 are formed on the interlayer insulating layer 160. The source electrode 177 and the drain electrode 176 contact the source area SA and the drain area DA of the second polycrystalline semiconductor layer 137 through the source contact hole 167 and the drain contact hole 166, respectively.

The thin film transistor 20, according to the present exemplary embodiment, is manufactured through the above discussed processes. Thereafter, the planarization layer 180 (see FIG. 3), the first OLED electrode 710 (see FIG. 3), the pixel definition film 190 (see FIG. 3), the organic emission layer 720 (see FIG. 3), and the second OLED electrode 730 are sequentially formed on the source electrode 177 and the drain electrode 176, thereby forming the organic light emitting diode (OLED) display.

As described above, in the method of manufacturing the thin film transistor 20, according to the present exemplary embodiment, the first polycrystalline semiconductor layer 136 and the second polycrystalline semiconductor layer 137 have the third width W3. They are formed by patterning parts of the first polycrystalline semiconductor layer 136 and the second polycrystalline semiconductor layer 137 in which the metallic components of the metal catalysts 125 remain therein in relatively large. Accordingly, a relatively small amount of the metallic components remains within the first polycrystalline semiconductor layer 136 and the second polycrystalline semiconductor layer 137. That is, a concentration of metal within the first polycrystalline semiconductor layer 136 and the second polycrystalline semiconductor layer 137 is relatively low, and thus, a deterioration of the semiconductor characteristic of the thin film transistor is minimized.

Figure 14:
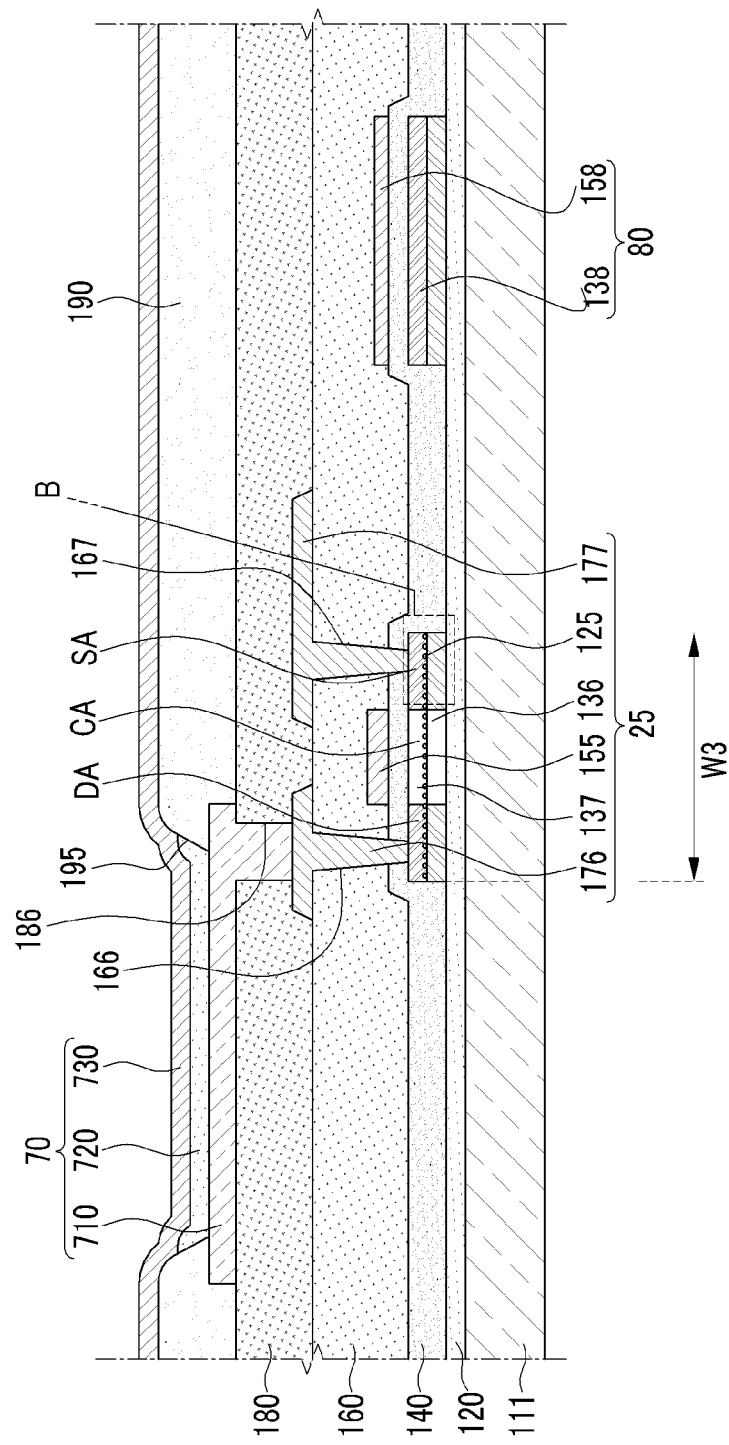
FIG. 14 is an enlarged cross-sectional view of an organic light emitting diode (OLED) display according to an exemplary embodiment.
Figure 15:
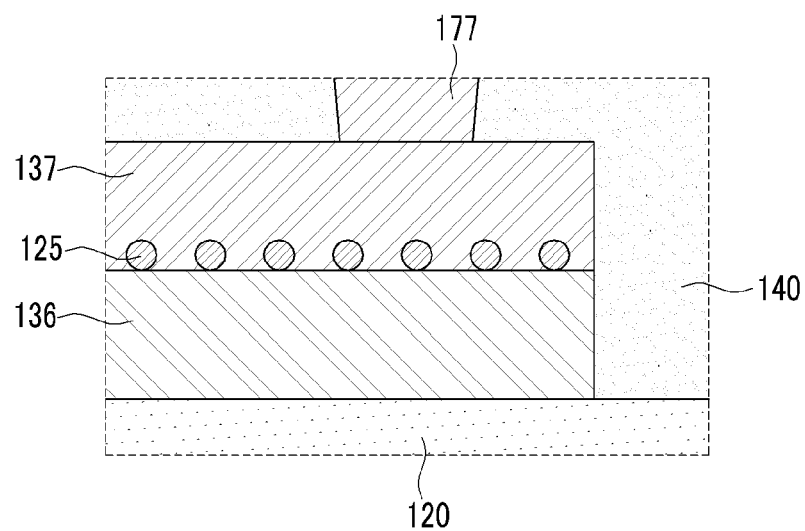
FIG. 15 is an enlarged view of a portion 'B' in FIG. 14.

Hereinafter, an organic light emitting diode (OLED) display 102 according to a another exemplary embodiment is described with reference to FIGS. 14 and 15. FIG. 14 is a partially enlarged cross-sectional view of the organic light emitting diode (OLED) display 102 according to the present exemplary embodiment. FIG. 15 is an enlarged view of a portion 'B' of FIG. 14.

As shown in FIGS. 14 and 15, the organic light emitting diode (OLED) display 102, according to the present exemplary embodiment, includes metal catalysts 125 configured to adjoin to a first polycrystalline semiconductor layer 136 and disposed between the first polycrystalline semiconductor layer 136 and a second polycrystalline semiconductor layer 137. The first polycrystalline semiconductor layer 136 and the second polycrystalline semiconductor layer 137 are crystallized using the metal catalysts 125 disposed between the first polycrystalline semiconductor layer 136 and the second polycrystalline semiconductor layer 137. A thin film transistor 25 of in the organic light emitting diode (OLED) display 102, according to the present exemplary embodiment, has a low leakage current because a relatively small amount of metallic components remain within the first polycrystalline semiconductor layer 136 and the second polycrystalline semiconductor layer 137.

As described above, in the thin film transistor 25, the first polycrystalline semiconductor layer 136 and the second polycrystalline semiconductor layer 137, constituting the thin film transistor 25, are crystallized using the metal catalysts 125. Accordingly, the electron mobility of the first polycrystalline semiconductor layer 136 and the second polycrystalline semiconductor layer 137 is high. Thus, the semiconductor characteristic of the thin film transistor 25 can be improved. Consequently, the organic light emitting diode (OLED) display 102 including the thin film transistor 25 has an improved display quality.

Further, as described above, in the thin film transistor 25, the first polycrystalline semiconductor layer 136 and the second polycrystalline semiconductor layer 137 are crystallized using the metal catalysts, but a relatively small amount of metallic components remain within the first polycrystalline semiconductor layer 136 and the second polycrystalline semiconductor layer 137. Accordingly, a deterioration of the semiconductor characteristic of the thin film transistor 25 is minimized. Consequently, a deterioration of the display quality of the organic light emitting diode (OLED) display 102 including the thin film transistor 25 is minimized.

Figure 16:
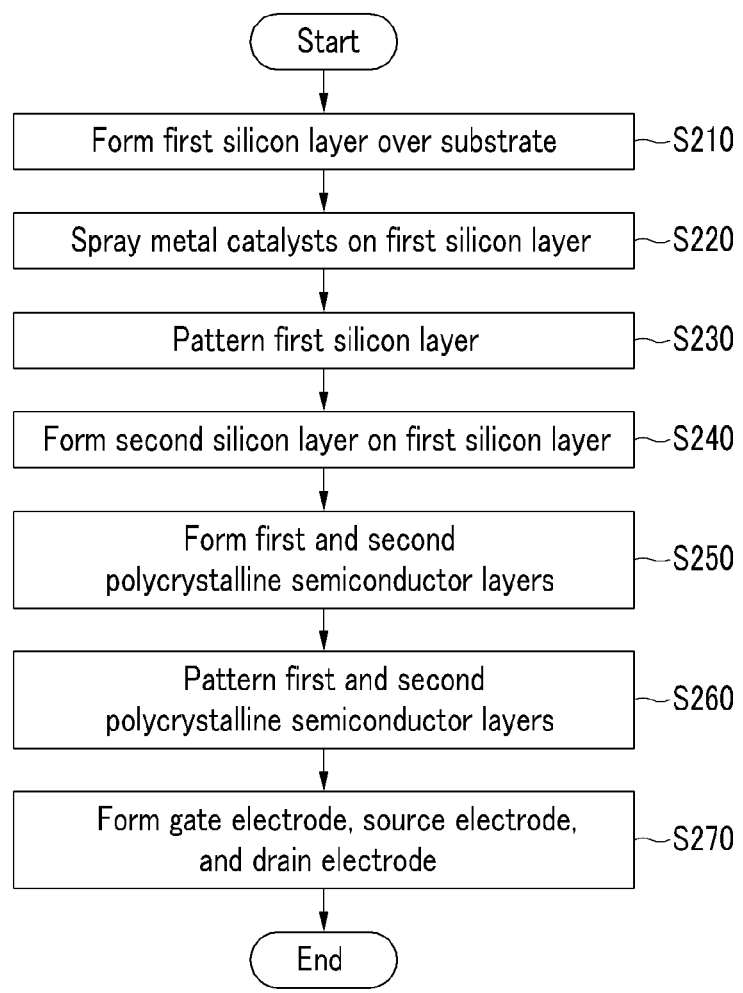
FIG. 16 is a flowchart illustrating a method of manufacturing a thin film transistor according to an exemplary embodiment.

Hereinafter, a method of manufacturing a thin film transistor 25 according to another exemplary embodiment is described with reference to FIGS. 16 to 21. FIG. 16 is a flowchart illustrating the method of manufacturing the thin film transistor 25 according to the present exemplary embodiment. FIGS. 17 to 21 are diagrams illustrating the method of manufacturing the thin film transistor according to the present exemplary embodiment.

Figure 17:
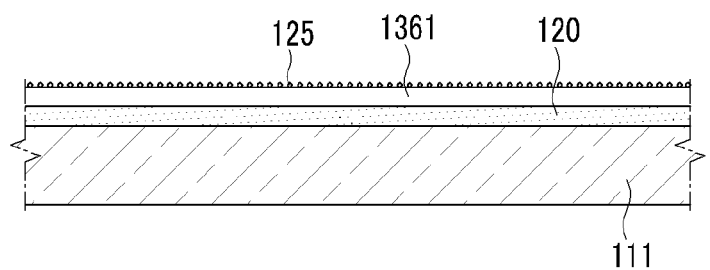
FIGS. 17 to 21 are diagrams illustrating the method of manufacturing the thin film transistor according to the exemplary embodiment of FIG. 16.

First, as shown in FIGS. 16 and 17, a first silicon layer 1361 is formed on a substrate 111 in operation S210. More particularly, a buffer layer 120 is formed on the insulating substrate 111, the first silicon layer 1361 including amorphous silicon is formed on the buffer layer 120. Metal catalysts 125 are sprayed on the first silicon layer 1361 at specific intervals in operation S220.

More particularly, the metal catalysts 125 are sprayed on the first silicon layer 1361 so that they are spaced apart from one another at specific intervals. The metal catalysts 125 are disposed on the first silicon layer 1361 at a concentration of $10^{12}/cm^2$ to $10^{14}/cm^2$. The metal catalysts 125 include one or more of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt). Nickel (Ni) is preferably used as the metal catalysts 125. However, aspects of the present invention are not limited thereto, and other suitable materials may be used as the metal catalysts 125. The metal catalysts 125 are disposed on the buffer layer 120 in a molecular unit as the smallest unit.

Figure 18:
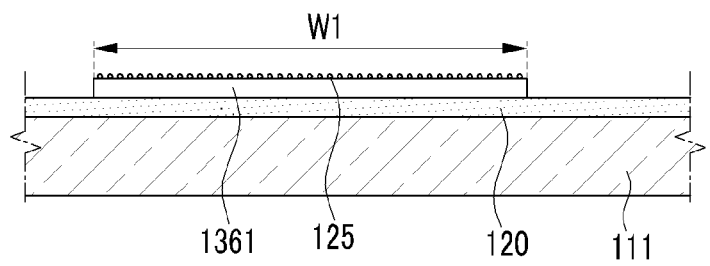
Figure 19:
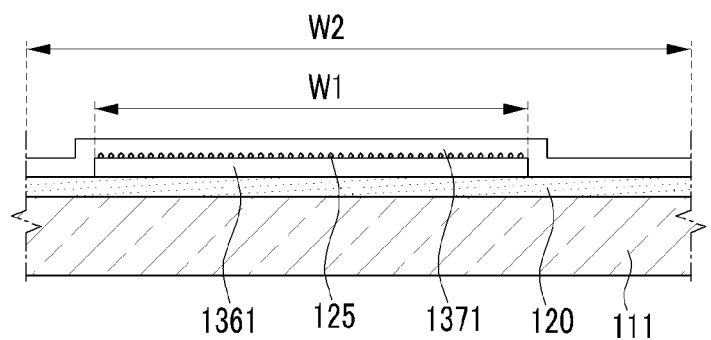

Next, as shown in FIG. 18, the first silicon layer 1361 is patterned to have a first width W1 in operation S230. More particularly, the first silicon layer 1361, on which the metal catalysts 125 have been sprayed, is patterned using a microelectromechanical systems (MEMS) technique, such as a photolithography process, so that the first silicon layer 1361 has the first width W1. Next, as shown in FIG. 19, a second silicon layer 1371, having a second width W2 greater than the first width W1, is formed on the first silicon layer 1361. The second silicon layer 1371 covers the first silicon layer 1361. Also, the metal catalysts 125 are interposed between the second silicon layer 1371 and the first silicon layer 1361 in operation S240.

More particularly, the second silicon layer 1371 is formed on the first silicon layer 1361 having the first width W1 so that it covers the first silicon layer 1361 with the metal catalysts 125 interposed between the second silicon layer 1371 and the first silicon layer 1361.

Figure 20:
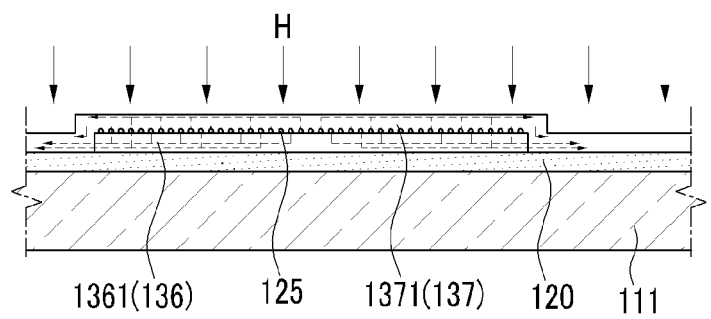

Next, as shown in FIG. 20, the first silicon layer 1361 is formed into a first polycrystalline semiconductor layer 136 and the second silicon layer 1371 is formed into a second polycrystalline semiconductor layer 137, by heating the first silicon layer 1361 and the second silicon layer 1371 in operation S250.

More particularly, the first silicon layer 1361 and the second silicon layer 1371 are heated (H) in a temperature range of 600° C. to 700° C. The heating (H) is performed for 10 minutes to 20 hours. If the first silicon layer 1361 and the second silicon layer 1371 are heated at a temperature of less than 600° C., the first silicon layer 1361 and the second silicon layer 1371 may not be fully crystallized. If the first silicon layer 1361 and the second silicon layer 1371 are heated at a temperature of more than 700° C., the substrate 111 can be deformed by heat. When the first silicon layer 1361 and the second silicon layer 1371 are heated, the metal catalysts 125 disposed between the first silicon layer 1361 and the second silicon layer 1371 are diffused.

The diffusion of the metal catalysts 125 is performed from a portion between the first silicon layer 1361 and the second silicon layer 1371 and extends towards both ends of the second silicon layer 1371 via the first silicon layer 1361 in the direction of arrows indicated in FIG. 10. At the same time, the diffusion is performed from a portion between the first silicon layer 1361 and the second silicon layer 1371 and extends towards both ends of the second silicon layer 1371. If nickel (Ni) is used as the metal catalysts 125, the metal catalysts 125 are diffused and the nickel (Ni) is combined with the silicon (Si) of the first silicon layer 1361 and the second silicon layer 1371. Accordingly, nickel disilicide ($NiSi_2$) is formed within the first silicon layer 1361 and the second silicon layer 1371. The nickel disilicide ($NiSi_2$) formed within the first silicon layer 1361 and the second silicon layer 1371 becomes a seed. Crystals are grown around the seed within the first silicon layer 1361 and the second silicon layer 1371. Consequently, the first silicon layer 1361 is formed into the first polycrystalline semiconductor layer 136, and the second silicon layer 1371 is formed into the second polycrystalline semiconductor layer 137.

Figure 21:
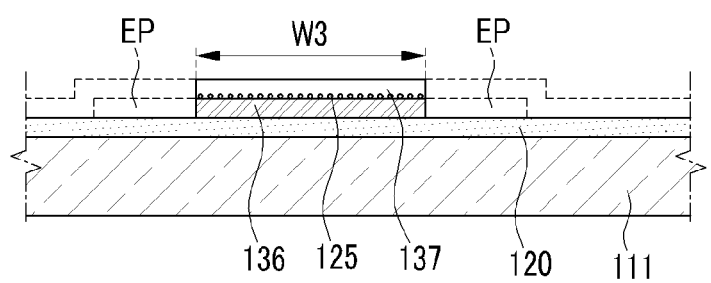

Next, as shown in FIG. 21, the first polycrystalline semiconductor layer 136 and the second polycrystalline semiconductor layer 137 are patterned so that they have a third width W3 smaller than the first width W1 in operation S260. More particularly, the first polycrystalline semiconductor layer 136 and the second polycrystalline semiconductor layer 137 are patterned using a microelectromechanical systems (MEMS) technique, such as a photolithography process, so that they have the third width W3 smaller than the first width W1 of the first polycrystalline semiconductor layer 136. Since both the first polycrystalline semiconductor layer 136 and the second polycrystalline semiconductor layer 137 are patterned, both ends EP of the first polycrystalline semiconductor layer 136 are removed. Accordingly, an interface between the second polycrystalline semiconductor layer 137 and both ends EP of the first polycrystalline semiconductor layer 136 is removed. At the same time, both ends of the second polycrystalline semiconductor layer 137 are removed. Consequently, the amount of metallic components remaining within the first polycrystalline semiconductor layer 136 and the second polycrystalline semiconductor layer 137 is relatively reduced.

Next, a gate electrode, a source electrode, and a drain electrode are formed in operation S270. The thin film transistor 25 according to the present exemplary embodiment is manufactured through the above-described processes. Although not shown, a planarization layer, a first electrode, a pixel definition film, an organic emission layer, and a second electrode are sequentially formed on the source electrode and the drain electrode, thereby the organic light emitting diode (OLED) display, according to the present embodiment, is manufactured.

As described above, in the method of manufacturing the thin film transistor 25, according to the present exemplary embodiment, the first polycrystalline semiconductor layer 136 and the second polycrystalline semiconductor layer 137 are formed by patterning their respective parts in which the metallic components of the metal catalysts 125 remain in a relatively large amount. Accordingly, the amount of the metallic components remaining within the first polycrystalline semiconductor layer 136 and the second polycrystalline semiconductor layer 137 is relatively small. That is, the concentration of metal within the first polycrystalline semiconductor layer 136 and the second polycrystalline semiconductor layer 137 is relatively low, and thus, a deterioration of the semiconductor characteristic of the thin film transistor is minimized.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
a first polycrystalline semiconductor layer disposed on a substrate;
a second polycrystalline semiconductor layer disposed on the first polycrystalline semiconductor layer, the second polycrystalline semiconductor layer being disposed in a vertically different layer than the first polycrystalline semiconductor layer; and
metal catalysts, some of the metal catalysts disposed along the first polycrystalline semiconductor layer, the some of the metal catalysts being further disposed vertically between the second polycrystalline semiconductor layer and the substrate,
wherein the first polycrystalline semiconductor layer and the second polycrystalline semiconductor layer are both metal catalyst crystallized polycrystalline semiconductor layers comprising some of the metal catalysts.

2. The thin film transistor of claim 1, wherein the metal catalysts comprise at least one of nickel (Ni), palladium (Pd), titanium (Ti), silver (Ag), gold (Au), tin (Sn), antimony (Sb), copper (Cu), cobalt (Co), molybdenum (Mo), terbium (Tb), ruthenium (Ru), cadmium (Cd), and platinum (Pt).

3. The thin film transistor of claim 1, wherein the second polycrystalline semiconductor layer has a thickness which is 0.3 to 3 times a thickness of the first polycrystalline semiconductor layer.

4. The thin film transistor of claim 1, further comprising a buffer layer disposed on the substrate,
wherein the metal catalysts are disposed directly between the buffer layer and the first polycrystalline semiconductor layer.

5. The thin film transistor of claim 4, further comprising:
a gate electrode disposed on the second polycrystalline semiconductor layer;
a source electrode; and
a drain electrode,
wherein the source electrode and the drain electrode are connected to the second polycrystalline semiconductor layer.

6. A display device, comprising:
a substrate; and
a thin film transistor, comprising:
a first polycrystalline semiconductor layer disposed on the substrate;
a second polycrystalline semiconductor layer disposed on the first polycrystalline semiconductor layer, the second polycrystalline semiconductor layer being disposed in a vertically different layer than the first polycrystalline semiconductor layer; and
metal catalysts, some of the metal catalysts being disposed along the first polycrystalline semiconductor layer, the some of the metal catalysts being further disposed vertically between the second polycrystalline semiconductor layer and the substrate,
wherein the first polycrystalline semiconductor layer and the second polycrystalline semiconductor layer are both metal catalyst crystallized polycrystalline semiconductor layers comprising some of the metal catalysts.

7. The display device of claim 6, further comprising a buffer layer disposed on the substrate,
wherein the metal catalysts are disposed directly between the buffer layer and the first polycrystalline semiconductor layer.

8. The display device of claim 7, further comprising an organic light emitting element, comprising:
a first electrode connected to the thin film transistor;
an organic emission layer disposed on the first electrode; and
a second electrode disposed on the organic emission layer.

9. The display device of claim 8, wherein the thin film transistor further comprises:
a gate electrode disposed on the second polycrystalline semiconductor layer;
a source electrode; and
a drain electrode, wherein the source electrode and the drain electrode are connected to the second polycrystalline semiconductor layer, and wherein the first electrode is connected to the drain electrode.

10. The display device of claim 8, further comprising a capacitor comprising:

a first capacitor electrode formed on the substrate and of the same layers as the first polycrystalline semiconductor layer and the second polycrystalline semiconductor layer of the thin film transistor;

a second capacitor electrode formed on the first capacitor electrode; and an insulating layer formed between the first capacitor electrode and the second capacitor electrode.

\* \* \* \* \*